United States Patent
Agraffeil

(10) Patent No.: US 9,514,962 B2
(45) Date of Patent: Dec. 6, 2016

(54) METHOD FOR PERFORMING ACTIVATION OF DOPANTS IN A GAN-BASE SEMICONDUCTOR LAYER

(71) Applicant: COMMISSARIAT À L'ÉNERGIE ATOMIQUE ET AUX ÉNERGIES ALTERNATIVES, Paris (FR)

(72) Inventor: Claire Agraffeil, Grenoble (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 14/859,860

(22) Filed: Sep. 21, 2015

(65) Prior Publication Data

US 2016/0093510 A1   Mar. 31, 2016

(30) Foreign Application Priority Data

Sep. 26, 2014 (FR) ...................... 14 59126

(51) Int. Cl.
*H01L 21/324* (2006.01)
*H01L 21/265* (2006.01)
*H01L 21/225* (2006.01)
*H01L 29/20* (2006.01)

(52) U.S. Cl.
CPC ....... *H01L 21/3245* (2013.01); *H01L 21/2258* (2013.01); *H01L 21/26553* (2013.01); *H01L 29/2003* (2013.01)

(58) Field of Classification Search
None
See application file for complete search history.

(56) References Cited

U.S. PATENT DOCUMENTS

| 5,306,662 A * | 4/1994 | Nakamura | H01L 33/007 148/DIG. 3 |
| 5,766,695 A * | 6/1998 | Nguyen | H01L 21/2654 148/DIG. 40 |
| 2006/0286784 A1 | 12/2006 | Usov et al. | |
| 2007/0134834 A1 | 6/2007 | Lee et al. | |
| 2007/0269968 A1 | 11/2007 | Saxler et al. | |

(Continued)

FOREIGN PATENT DOCUMENTS

WO    82/01619 A1    5/1982

OTHER PUBLICATIONS

Cayrel, F. et al. "Si implanted in GaN grown on sapphire using AlN and oxide cap layers," Nuclear Instruments & Methods in Physics Research, Section—B/Beam Interactions With Materials and Atoms, vol. 272, pp. 137-140, 2012.

(Continued)

*Primary Examiner* — Andres Munoz
(74) *Attorney, Agent, or Firm* — Oliff PLC

(57) ABSTRACT

The method for performing activation of p-type dopants in a GaN-based semiconductor includes a first step of providing a substrate including (i) a GaN-based semiconductor material layer including p-type electric dopant impurities, (ii) a cap block devoid of any silicon-based compound, in contact with the semiconductor material layer, and (iii) a silicon-based covering layer covering the cap block. The method includes a second heat treatment step at a temperature of more than 900° C. so as to activate the p-type electric dopant impurities in the semiconductor material layer.

20 Claims, 6 Drawing Sheets

(56) References Cited

U.S. PATENT DOCUMENTS

| | | |
|---|---|---|
| 2010/0133656 A1 | 6/2010 | Hager, IV et al. |
| 2010/0147835 A1 | 6/2010 | Mulpuri et al. |
| 2010/0171126 A1 | 7/2010 | Briere |
| 2012/0068188 A1 | 3/2012 | Feigelson et al. |
| 2013/0056793 A1* | 3/2013 | Srinivasan .......... H01L 21/0237 257/183 |
| 2016/0061528 A1 | 3/2016 | Derenge |

OTHER PUBLICATIONS

Lorenz, K et al. "High-temperature anealing and optical activation of Eu-implanted GaN," Applied Physics Letters, American Institute of Physics, vol. 85, No. 14, pp. 2712-2714, 2004.

Hager, C. E. et al. "Activation of ion implanted Si in GaN using a dual AlN annealing cap," J. Appl. Phys., vol. 105, pp. 033713-1 to 033713-7, 2009.

Miranda, S. M. C. et al, "Sequential multiple-step europium ion implantation and annealing of GaN," Physica Status Solidi (C), vol. 11, No. 2, pp. 253-257, 2014.

Chan, J. S. et al, "Thermal Annealing Characteristics of Si and Mg-implanted GaN thin films," Applied Physics Letters, American Institute of Physics, vol. 68, No. 19, pp. 2702-2704, 1996.

Nogales, E. et al, "Failure Mechanism of AlN nanocaps used to protect rare earth-implanted GaN during high temperature annealing," Applied Physics Letters, American Institute of Physics, vol. 88, No. 3, pp. 031902-1 to 031902-3, 2006.

Porowski, et al, "Annealing of GaN Under High Pressure of Nitrogen," Journal of Physics: Condensed Matter, vol. 14, pp. 11097-11110, 2002.

Feigelson, et al, "Multicycle Rapid Thermal Annealing Technique and its Application for the Electrical Activation of Mg Implanted in GaN," Journal of Crystal Growth, vol. 350, pp. 21-26, 2012.

Aluri, et al, "Microwave Annealing of Mg-implanted and in situ Be-doped GaN," Journal of Applied Physics, American Institute of Physics, vol. 108, No. 8, pp. 083103-1 to 083103-7, 2010.

Hwang, et al, "Enhancing P-Type Conductivity in Mg-Doped GaN Using Oxygen and Nitrogen Plasma Activation," Japanese Journal of Applied Physics, Japan Society of Applied Physics, vol. 44, No. 4A, pp. 1726-1729, 2005.

Kim, et al, "Reactivation of Mg Acceptor in Mg-doped GaN by Nitrogen Plasma Treatment," Applied Physics Letters, American Institute of Physics, vol. 76, No. 21, pp. 3079-3081, 2000.

Shintani, et al, "Etching of GaN Using Phosphoric Acid," Journal of the Electrochemical Society, vol. 123, No. 5, pp. 706-713, 1976.

Gupta, "Plasma Immersion Ion Implantation (PIII) Process-Physics and Technology," International Journal of Advancements in Technology, vol. 2, No. 4, pp. 471-490, 2011.

Wu, et al, "Positive and Negative Effects of Oxygen in Thermal Annealing of p-type GaN," Semiconductor Science Technology, vol. 27, 085017, pp. 1-3, 2012.

Nomoto, et al, "Remarkable Reduction of On-Resistance by Ion Implantation in GaN/AlGaN/GaN HEMTs with Low Gate Leakage Current," IEEE Electron Device Letters, IEEE Service Center, vol. 28, No. 11, pp. 939-941, 2007.

International Business Machines Corp., "Three-Dimensional Semiconductor Device Structures Using Channeled Ion Implantation and Annealing Techniques," IBM Technical Disclosure Bulletin, vol. 32, No. 4A, pp. 358-359, 1989.

Whelan, et al, "The Dependence of the Radiation Damage Formation on the Substrate Implant Temperature in GaN during Mg ion implantation," Journal of Applied Physics, American Institute of Physics, vol. 98, No. 1, pp. 013515-1 to 013515-5, 2005.

International Business Machines Corp., "Forming of Low Resistance Ohmic Contacts to III-V Semiconductors," IBM Technical Disclosure Bulletin, vol. 32, No. 7, pp. 141-142, 1989.

Anonymous, "Barrier Height Enhancement by Recoil Implantation," Research Disclosure, Mason Publications, No. 292, pp. 932, 1988, XP000104853, ISSN:0374-4353.

Cao, et al, "Implanted p-n junctions in GaN," Solid State Electronics, vol. 43, pp. 1235-1238, 1999.

Baharin, et al, "Experimental and Numerical Investigation of the Electrical Characteristics of Vertical n-p Junction Diodes Created by Si Implantation into p-GaN," Institute of Electrical and Electronics Engineers, pp. 12-15, 2008.

U.S. Appl. No. 14/849,237, filed Sep. 9, 2015 in the name of Agraffeil.

U.S. Appl. No. 14/846,376, filed Sep. 4, 2015 in the name of Agraffeil.

U.S. Appl. No. 14/855,761, filed Sep. 16, 2015 in the name of Agraffeil.

Apr. 20, 2016 Office Action Issued in U.S. Appl. No. 14/846,376.
Jun. 15, 2016 Office Action issued in U.S. Appl. No. 14/855,761.
Feb. 25, 2016 Office Action issued in U.S. Appl. No. 14/849,237.

* cited by examiner

METHOD FOR PERFORMING ACTIVATION OF DOPANTS IN A GAN-BASE SEMICONDUCTOR LAYER

BACKGROUND OF THE INVENTION

The invention relates to a method for performing activation of dopants in a semiconductor layer.

STATE OF THE ART

Ion implantation is commonly used to dope semiconductors. The ions used for doping are generally produced from a gaseous or solid source and impact the semiconductor after they have been accelerated, for example, with an energy comprised between 10 and 500 keV.

Once implantation has been terminated, the doped semiconductor undergoes heat treatment designed to both restore the crystal quality of the semiconductor and to activate the dopants, i.e. to enable them to take the place of certain atoms of the crystal lattice of the semiconductor. The thermal budget applied also results in diffusion of the latter into the semiconductor.

For example, to obtain a high $Si^+$ ion (n-doping) or $Mg^+$ ion (p-doping) activation ratio in a GaN semiconductor layer, one solution can be to perform heat treatment of the material without covering it with a cap layer. The heat treatment can for example be performed at a temperature of more than 1000° C., at a pressure of more than 15 kbar, and in a controlled nitrogen atmosphere. However performing annealing at such a high pressure is only possible if a suitable device is available which limits the advantages of such a method.

If the heat treatment is not performed at high pressure, the surface of the semiconductor may then be impaired. For example, GaN is a semiconductor the surface of which can be damaged when the annealing temperature is higher than 850° C. and when the annealing is performed at atmospheric pressure. Cracks or holes can appear at the surface of the semiconductor material.

To prevent the semiconductors from being damaged, a protective cap layer can be deposited over the semiconductor before or after the ion implantation, and before the heat treatment is performed. The cap layer enables the semiconductor to be annealed at a higher temperature than that which it would be able to withstand without applying a high pressure such as 15 kbar. The doped semiconductor then contains less defects.

The document "Si implanted reactivation in GaN grown on sapphire using AlN and oxide cap layers" (F. Cayrel et al., Nuclear Instruments and Methods in Physics Research B, 272 (2012) 137-140) compares the efficiency of a $SiO_2$ cap layer and of an AlN cap layer deposited on a GaN semiconductor layer. By means of one or the other of the cap layers, anneals of a duration of 30 seconds to 8 hours at temperatures comprised between 1000 and 1150° C. are possible. The surface roughness of the GaN layer is lower when the cap layer is a $SiO_2$ layer. On the other hand, the specific contact resistance is better when the cap layer is an AlN layer, which means that the electric activation of the dopants is higher with the AlN layer than with the $SiO_2$ layer.

The document "Activation of ion implanted Si in GaN using a dual AlN annealing cap" (C. E. Hager et al., J Appl. Phys. 105, 033713, (2009)) shows the advantages of two superposed layers of AlN for n-doping of a GaN semiconductor. Here the stack comprises:

a first layer with a thickness of about 80 nm, deposited by Metalorganic Chemical Vapor Deposition (MOCVD), at the same temperature as the growth temperature of the semiconductor and acting as adhesion layer given that the thermal expansion coefficients of GaN and of AlN are of the same order of magnitude;

a second layer of AlN with a thickness of about 1 μm, deposited by cathode sputtering above the first layer, having the purpose of enhancing the protection provided by the first layer.

By means of these two layers, it is possible to anneal the semiconductor at temperatures able to be up to 1250° C. for 30 minutes. This enables an electric activation ratio of the atoms of about 70% to be obtained, while at the same time limiting the damage to the surface of the GaN semiconductor.

OBJECT OF THE INVENTION

It is observed that a requirement exists to provide a method for performing activation of p-type dopants in a GaN-based semiconductor enabling a high activation ratio to be obtained while at the same time preventing the surface of the semiconductor layer from being damaged.

This problem tends to be solved by means of a method which comprises the following steps:
providing a substrate comprising:
a layer made from GaN-based semiconductor material provided with p-type electric dopant impurities,
a protective cap block devoid of any silicon-based compound, in contact with the semiconductor material layer,
a silicon-based covering layer covering the protective cap block,
performing heat treatment at a temperature of more than 850° C. so as to activate the p-type electric dopant impurities in the semiconductor material layer.

The cap block can comprise a layer of Mg or MgO having a thickness comprised between 1 and 30 nm, preferentially between 1 and 15 nm, ideally between 4 and 5 nm.

It can further comprise an AlGaN layer positioned between the semiconductor material layer and the Mg or MgO layer, the AlGaN layer having a thickness comprised between 1 and 40 nm, preferentially between 5 and 20 nm. The AlGaN layer can then comprise up to 50% of Ga, advantageously up to 20% of Ga, and preferentially less than 5% of Ga. According to an alternative, the AlGaN layer can be completely devoid of Ga.

According to a particular embodiment, the cap block can also comprise an additional layer of AlN or of AlGaN having a thickness comprised between 1 and 40 nm, preferentially between 5 and 20 nm, positioned between the Mg or MgO layer and the covering layer.

According to one feature of the invention, deposition of the covering layer can be performed at a temperature of less than 850° C., preferentially comprised between 700 and 800° C. The material of the covering layer can be chosen from silicon, silicon oxide, or silicon nitride. The thickness of the covering layer can be comprised between 5 and 500 nm, preferentially between 50 and 150 nm, and ideally equal to 100 nm.

Furthermore, implantation of the dopant ions can be performed at a temperature comprised between 15° C. and 700° C.:
before deposition of the cap block, or
after deposition of the cap block and before deposition of the covering layer, or after deposition of the covering layer.

As far as the heat treatment is concerned, the latter can be performed in an atmosphere comprising a gas chosen for example from $N_2$, $NF_3$, $NH_3$, Ar, He, or mixtures of $N_2/H_2$ or $Ar/H_2$. It can comprise at least one annealing performed at a temperature of more than 1000° C.

The heat treatment step can further be performed at a pressure comprised between 1 bar and 15 kbar, advantageously between 1 bar and 1 kbar, preferentially between 1 and 10 bars, and ideally at 1 bar.

Finally, the thickness of the semiconductor material layer can be comprised between 5 nm and 10 μm, preferentially 500 nm and 10 μm, advantageously equal to 1 μm.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

Figure 1:
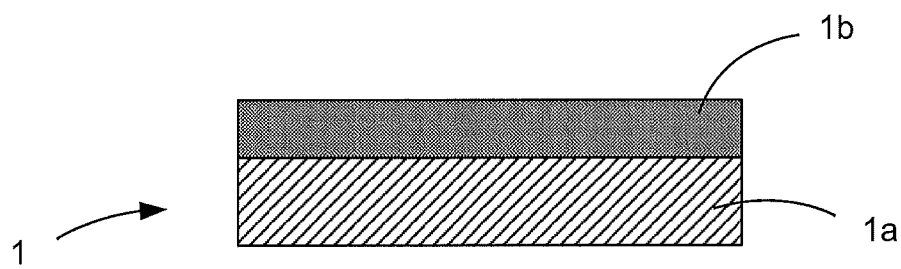
FIG. 1 illustrates a substrate provided with a semiconductor material layer.
Figure 2:
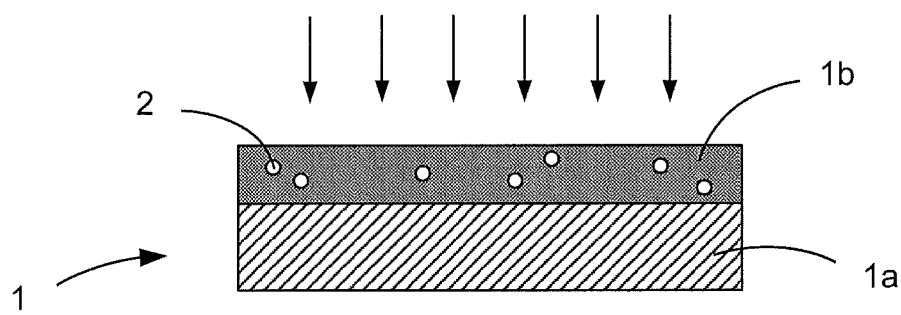
FIG. 2 illustrates an implantation phase of electric dopant impurities.

According to an implementation of the method for performing activation of dopants represented in FIGS. 1 to 12, it is first of all necessary to provide a substrate 1 advantageously comprising a support 1a for example made from silicon, sapphire, $Al_2O_3$, or SiC, and a GaN-based semiconductor material layer 1b (cf. FIG. 1). As an alternative, substrate 1 can be made from bulk GaN.

When substrate 1 is a bulk GaN block, it is possible to cover the back surface of the cap layers advantageously identical to those deposited on substrate 1 on the front surface, and which will be described in the following. The front surface of substrate 1 is defined here as being the surface impacted by the beam of dopant impurities, and the back surface as being the opposite surface to the front surface.

Fabrication of substrate 1 can comprise a first cleaning step of support 1a, such as for example RCA cleaning if support 1a is made from silicon.

Semiconductor material layer 1b is then fabricated by epitaxial growth directly on support 1a. The material of support 1a has to be chosen carefully to have similar lattice parameters to those of semiconductor material layer 1b in order for the latter to grow in coherent manner. To improve the quality of semiconductor material layer 1b, an AlGaN-based intermediate layer may be deposited on support 1a before epitaxial growth of layer 1b (embodiment not represented).

When fabrication of semiconductor material layer 1b has been terminated, the latter can advantageously have a thickness comprised between 5 nm and 10 μm, preferentially between 500 nm and 1.5 μm, and ideally equal to 1 μm.

Substrate 1 is designed to be annealed at high temperature, for example of more than 850° C., in order to activate dopant species 2 after implantation. However, above a temperature of about 850° C., GaN-based semiconductor material layer 1b is considerably impaired. Cap layers are therefore used to perform heat treatment of substrate 1 at high temperature while at the same time greatly limiting impairment of the surface of semiconductor layer 1b.

For this purpose, a cap block 3 devoid of any silicon-based compound is deposited on substrate 1. Its nature depends on the type of doping required for semiconductor layer 1b.

Figure 3:
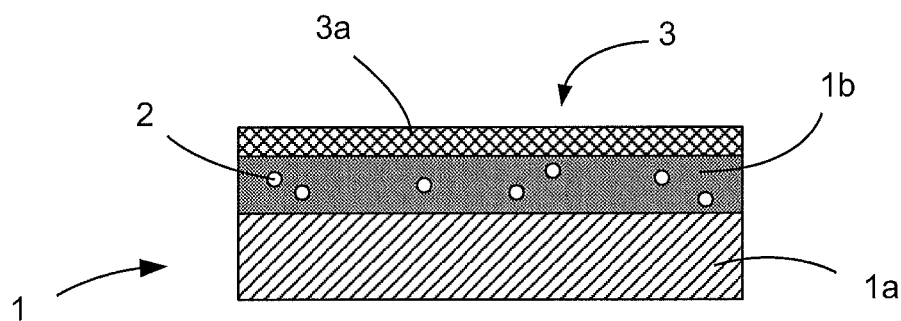
FIGS. 3 to 7 illustrate four possible configurations of a substrate covered by a cap block.

When the required doping of semiconductor material layer 1b is n-doping, cap block 3 is preferentially formed by a single AlGaN layer 3a (cf. FIG. 3). One of the roles of the AlGaN is to enable annealing of semiconductor layer 1b while at the same time limiting damage to the surface of the material and making the latter the least resistive possible.

AlGaN is a judiciously chosen material as its lattice parameters are very close to those of the gallium nitride-based semiconductor material, which enhances the adherence of cap block 3 on substrate 1.

AlGaN also enables a semiconductor material layer 1b to be fabricated that has not only a good electric quality but also an improved surface state and that is less resistive than in the prior art.

AlGaN layer 3a can comprise up to 50% of Ga, advantageously less than 20% of Ga and preferentially less than 5% of Ga (in atomic percentages). In a particular case, the AlGaN layer instead can be a layer completely devoid of Ga and therefore be an AlN layer.

AlGaN layer 3a can for example be deposited by MOCVD in identical equipment to that which was used for epitaxial growth of semiconductor material layer 1b. The deposition can be performed at the nucleation temperature of the material semiconductor or at a lower temperature, of about 500° C. for example. It is advantageous to deposit layer 1b and layer 3a in the same equipment without the substrate being placed in contact with the air.

In alternative manner, in the case of n-doping, cap block 3 can be a single AlN layer 3a. The latter can be fabricated by MOCVD, by Physical Vapor Deposition (PVD) or by any other deposition technique of the microelectronics field enabling this type of layer to be deposited.

Layer 3a advantageously has a thickness comprised between 1 and 40 nm, more preferentially between 5 and 20 nm, and ideally equal to 10 nm. This thickness is sufficient to create an efficient barrier in order to prevent evaporation of the nitrogen molecules of semiconductor material layer 1b when the annealing is performed. A thickness of 10 nm is sufficient to prevent damage to layer 3a during the heat treatment, which may go as far as forming cracks depriving the semiconductor layer of a protection area. This thickness is also sufficiently small to be eliminated without difficulty on completion of the doping process.

In the case where p-type doping is sought for, a cap block 3 comprising an AlGaN layer and a layer of Mg or MgO can be deposited on substrate 1. Depending on the embodiments, the Mg or MgO layer can separate the AlGaN layer and semiconductor material layer 1b. It is also possible to provide for the Mg or MgO layer to be separated from semiconductor material layer 1b by the AlGaN layer.

Figure 4:
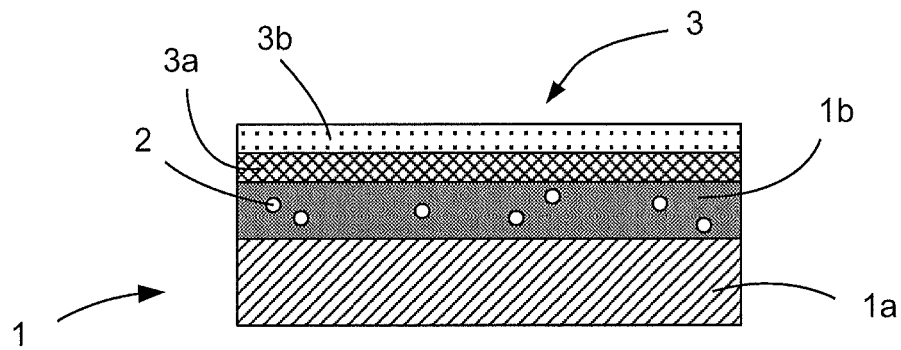

According to a first embodiment illustrated in FIG. 4, cap block 3 comprises an AlGaN or AlN layer 3a in contact with semiconductor material layer 1b, and a Mg or MgO layer 3b in contact with layer 3a.

The Mg or MgO layer acts as a reservoir of Mg atoms which constitute p-type dopant impurities able to diffuse through AlGaN layer 3a to semiconductor material layer 1b. The AlGaN layer also prevents diffusion to semiconductor material layer 1b of species belonging to other layers able to be deposited above layer 3b.

Deposition of AlGaN layer 3a is advantageously performed by means of a similar method to the one that has just been described in relation with n-type doping. The thickness of AlGaN layer 3a is comprised between 1 and 40 nm, preferentially between 5 and 20 nm and ideally equal to 10 nm. This thickness range enables a sufficiently weak layer 3a to be had to allow diffusion of the Mg atoms in the direction of layer 1b and ensures a sufficient thickness to perform the barrier function for the other undesired species.

Mg or MgO layer 3b advantageously has a thickness comprised between 1 and 30 nm, preferentially between 1 and 15 nm, and ideally between 4 and 5 nm. At equal thickness, the inventors however observed that the use of a Mg layer instead of a MgO layer enables a semiconductor material layer having a higher doping.

The Mg or MgO layer 3b is deposited on the first AlGaN or AlN layer 3a by Ion Beam Deposition (IBD), by Physical Vapor Deposition (PVD), or by any other deposition technique known to the person skilled in the art enabling this type of material to be deposited. The deposition can for example be performed at ambient temperature and at atmospheric pressure. The combination of an AlGaN layer 3a and of a Mg or MgO layer 3b prevents formation of a dopant concentration well in semiconductor material layer 1b and an accumulation of dopants at its surface during the heat treatment. The distribution of the dopants according to the depth in semiconductor material 1b is more homogeneous than with techniques of the prior art.

Figure 5:
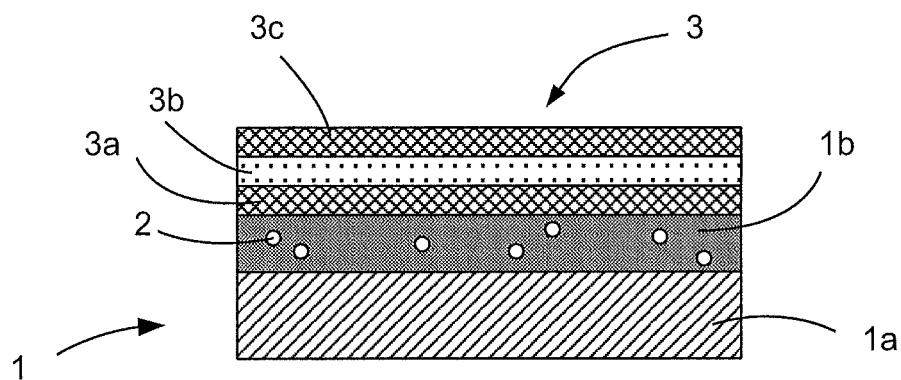

In an alternative embodiment of cap block 3, an additional AlN or AlGaN layer 3c can be deposited on Mg or MgO layer 3b (cf. FIG. 5). If layer 3c is made from AlGaN, it can comprise up to 50% of Ga, advantageously less than 20% of Ga and preferentially less than 5% of Ga (in atomic percentages).

This layer 3c can have a thickness comprised between 1 and 40 nm, preferentially between 5 and 20 nm and ideally equal to 10 nm. This thickness is sufficient for layer 3c to be able to play its role of diffusion barrier correctly against species originating from layers deposited above layer 3c.

If layers 3a and 3c are used, the sum of the thicknesses of layers 3a and 3c can advantageously be comprised in the 10-20 nm range to perform the barrier function. It is also possible to provide for the sum of the thicknesses of layers 3a and 3c and of the Mg or MgO layer to be comprised in the 14-25 nm range to perform the barrier function.

Growth of AlN layer 3c can for example be performed by MOCVD, by PVD, or by any deposition technique of the microelectronics field enabling this type of material to be deposited. The temperature at which deposition is performed is lower than or equal to the nucleation temperature of the semiconductor material.

AlN or AlGaN layer 3c, in association with AlGaN layer 3a, also enables Mg or MgO layer 3b to be sandwiched and ensures good temperature resistance of cap block 3 when the heat treatments are performed for activation of dopants 2. This particular stack enables a cap block containing a Mg or MgO layer that presents a thermal expansion coefficient close to that of layer 1b to be had, which reduces adhesion problems.

For example purposes, in a particularly advantageous embodiment of cap block 3, the latter comprises an AlGaN layer 3a, a Mg or MgO layer 3b and an AlN layer 3c in which the sum of the thicknesses of layers 3a and 3c is about 10 nm. The inventors in fact observed that such a thickness of AlGaN and/or of AlN prevents the formation of a Mg concentration well in semiconductor material layer 1b and an accumulation of Mg dopant impurities at its surface.

Figure 6:
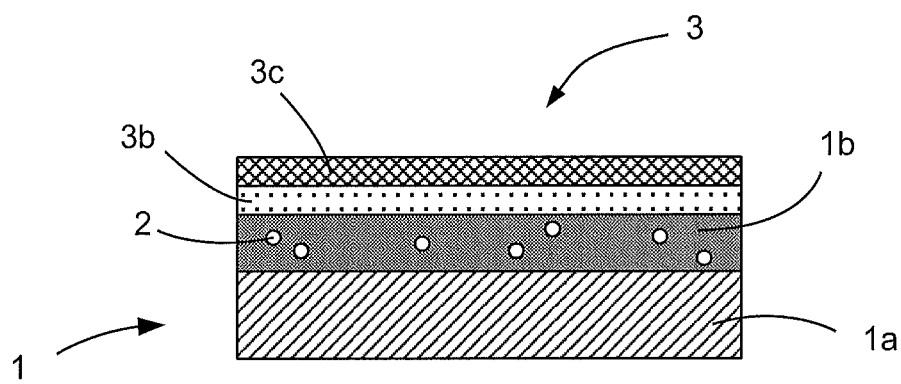

According to an alternative embodiment able to be used for a p-type doping, cap block 3 can comprise a Mg or MgO layer 3b deposited directly on semiconductor material layer 1b, and an AlN or AlGaN layer 3c deposited on layer 3b (cf. FIG. 6). The techniques used to deposit layer 3b are similar to those referred to in the foregoing, in particular by IBD or PVD.

This embodiment presents the advantage of being simpler to implement compared with incorporation of a cap block comprising three layers. It does however have to be kept in mind that take-off of layer 3b deposited directly on semiconductor material layer 1b is more difficult than take-off of an AlN or AlGaN layer.

In this embodiment, Mg or MgO layer 3b advantageously has a thickness comprised between 1 and 30 nm, preferentially between 1 and 15 nm, and ideally between 4 and 5 nm. AlN or AlGaN layer 3c can have a thickness comprised between 1 and 40 nm, preferentially between 5 and 20 nm and ideally equal to 10 nm.

Figure 7:
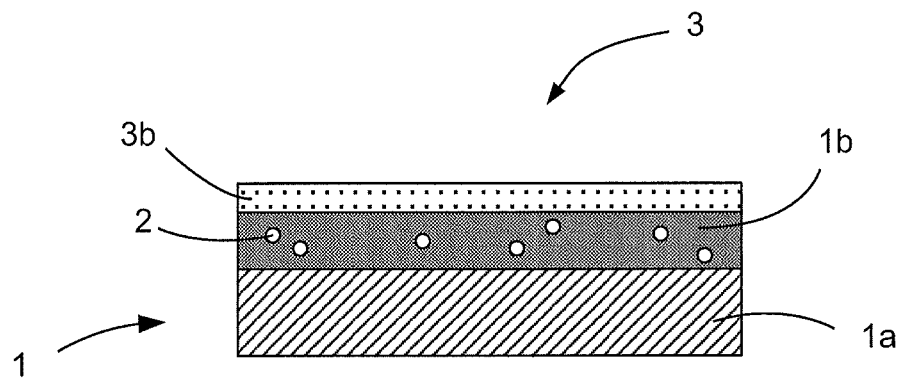

According to a fourth embodiment of cap block 3 used for p-doping of semiconductor material layer 1b, the cap block can contain a single Mg or MgO layer 3b (cf. FIG. 7). In this case, it can be advantageous to deposit a layer 3b having a thickness of more than 10 nm for cap block 3 to be able to play its role of protection barrier correctly when the heat treatment is performed.

Figure 8:
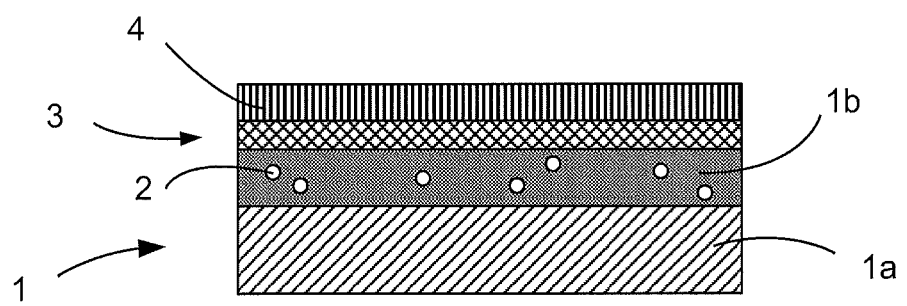
FIG. 8 presents a substrate covered by a cap block and by a covering layer.

Whether the doping performed is n-type or p-type, a silicon-based covering layer 4 is deposited on top of cap block 3. This step is illustrated in FIG. 8.

Covering layer 4 can be made from amorphous silicon, silicon oxide, or silicon nitride which may be stoichiometric or not and noted $Si_xN_y$. Layer 4 can advantageously be made from $SiO_2$, as this material is very resistant when temperature changes take place.

When the method is used to activate n-type dopants, it is not necessary for cap block 3 to be provided with a Mg or MgO layer. In this case, Si atoms can diffuse through cap block 3 in the direction of semiconductor material layer 1b, which enhances the n-type doping.

Deposition of covering layer 4 can be performed at a temperature of less than 850° C., and preferably comprised between 700 and 800° C., by LPCVD. Depending on the nature of the material of layer 4, it is possible to perform a Plasma Enhanced Chemical Vapor Deposition (PECVD) in a temperature range advantageously comprised between 200° C. and 600° C. Deposition performed by LPCVD is however preferred for the quality of the layer obtained. It is also possible to use any other deposition technique of the microelectronics field enabling this type of layer to be deposited.

In the case where deposition of covering layer 4 is performed by LPCVD, the growth rate of the material can advantageously be comprised between 2.5 and 3.5 nm/min in a temperature range comprised between 700 and 800° C.

This range of values presents the advantage of enabling better-quality crystal growth of covering layer 4, and therefore a better temperature resistance.

Once deposition has been completed, covering layer 4 can advantageously have a thickness comprised between 5 and 500 nm, preferentially between 50 and 150 nm and ideally equal to 100 nm. Covering layer 4 can be thicker than cap block 3 so as to enable a good temperature resistance of the whole assembly, and therefore to enable the temperature of the heat treatments applied for activation of the dopants to be increased.

To improve the adherence of covering layer 4 on cap block 3, cleaning of the surface of cap block 3 can be performed prior to the deposition step of covering layer 4. The cleaning can be performed for example by disoxidation by means of a solution of ammonium hydroxide $NH_4OH$ and of water with a (1:1) volume ratio at a temperature comprised between 60 and 70° C. In alternative manner, cleaning of the first covering layer can be performed by any other surface preparation chemistry suitable for the material.

Cap block 3 also enables the stresses between substrate 1 and covering layer 4, which have very different thermal expansion coefficients, to be limited. For illustrative purposes, gallium nitride has a thermal expansion coefficient equal to $5.6 \times 10^{-6}$ $K^{-1}$ and covering layer 4 can have a thermal expansion coefficient comprised between $0.5 \times 10^{-6}$ $K^{-1}$ and $3.3 \times 10^{-6}$ $K^{-1}$ depending on its chemical composition. The thermal expansion coefficient of cap block 3 made from aluminium nitride is $4.5 \times 10^{-6}$ $K^{-1}$, which corresponds to an intermediate value between that of substrate 1 and that of covering layer 4. Cap block 3 therefore acts as buffer between substrate 1 and covering layer 4 and limits the stresses of the stacks of the different layers on one another.

Furthermore, the materials of covering layer 4 have a better temperature resistance than the AlN used to fabricate cap block 3. Covering layer 4 therefore protects substrate 1 and cap block 3 during the heat treatment phase designed to activate the dopants implanted in semiconductor material layer 1b.

To dope semiconductor material layer 1b, an implantation can be performed after deposition of covering layer 4, or after deposition of cap block 3 and before deposition of covering layer 4. As an alternative, semiconductor material layer 1b can be doped directly by epitaxy during the MOCVD deposition, by ion beam or by immersion plasma before deposition of cap layer 3. These techniques can be implemented alone or in combination.

When the required doping of the semiconductor material layer is n-type, $Si^+$ ions can be implanted in layer 1b. In alternative manner, it can be envisaged to implant other species (ions or neutral) such as Be, Ge, O instead of the Si-type impurities.

To perform p-type doping, $Mg^+$ ions can be implanted in semiconductor material layer 1b. It is also possible to provide a $Mg^+/P^+$ co-implantation or $Mg^+/N^+$ co-implantation in semiconductor material layer 1b. Another option can be to implant other species (ions or neutral) such as Ca, Zn or C.

In conventional manner, the implantation conditions are imposed on the one hand by the technical performances of the implantation equipment and on the other hand by the concentration and location of the electric dopant impurities 2 which it is desired to implant in semiconductor material layer 1b. For example, for a $Mg^+$ ion beam having a fluence of $2 \cdot 10^{15}$ atoms/$cm^2$ and an energy of 200 keV, the implantation depth in a GaN semiconductor layer that is not covered by a cap layer is about 400 nm.

In the scope of the invention, the ion implantation can be performed with a fluence comprised between $1 \cdot 10^{14}$ and $1 \cdot 10^{16}$ atoms/$cm^2$ with an energy comprised between 25 and 1000 keV.

The implantation conditions also depend on the temperature conditions, i.e. the temperature at which substrate 1 is. According to one embodiment, implantation can be performed at ambient temperature or at a temperature comprised between 15° C. and 700° C.

Implantation of dopants 2 at a higher temperature than the ambient temperature enables damaging of the crystal lattice of the semiconductor to be limited and the latter to be partially reorganised before performing restoration heat treatment. In this way, the heat treatment can be performed during a shorter period and at a less high temperature.

Doping of semiconductor material layer 1b can be performed at different stages: either directly after deposition of semiconductor material layer 1b, or advantageously after deposition of cap block 3. Another alternative can be to perform the doping after deposition of covering layer 4.

When cap block 3 comprises several layers, it is possible to perform the implantation after deposition of any one of these layers.

In this case, the implantation energy of the electric dopant impurities has to be adjusted to pass through the layers of cap block 3. For an identical mean implantation depth, the energy of the ion beam has to be higher when the impurities are implanted through cap block 3 than when they are directly implanted after the epitaxial growth step of semiconductor material layer 1b.

Implanting the electric dopant impurities 2 after deposition of cap block 3 makes it possible for example to prevent a channelling effect during the ion implantation step. The channelling effect can result in a semiconductor material layer 1b the electric dopant impurities 2 of which are deeply implanted and are not distributed in homogeneous manner.

According to a third alternative embodiment, it is possible to perform implantation after cap block 3 and covering layer 4 have been deposited.

In this case, the implantation energy of the electric dopant impurities 2 in semiconductor material layer 2 has to be even higher than in the embodiments described in the foregoing in order for electric dopant impurities 2 to be able to pass through cap block 3 and covering layer 4.

Figure 9:
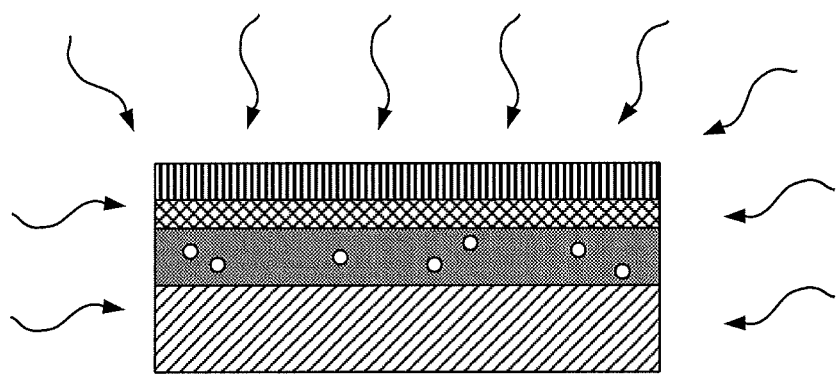
FIG. 9 illustrates the heat treatment step designed to activate the electric dopant impurities.
Figure 10:
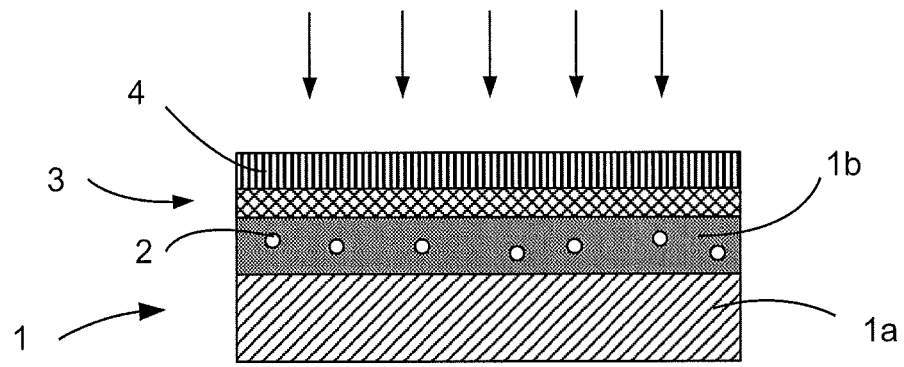
FIGS. 10 and 11 illustrate etching steps designed to remove the covering layer and the cap block from the substrate.
Figure 11:
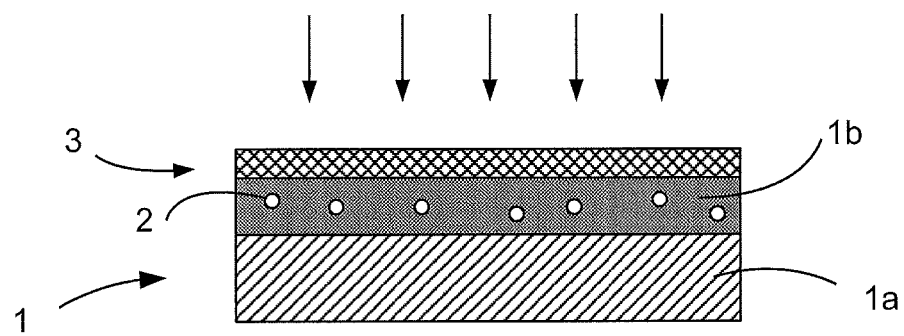

Once the implantation step has been performed, activation of the dopants is performed by heat treatment (cf. FIG. 9). The nature of the materials of covering layer 4 enables Rapid Thermal Annealing (RTA) and Rapid Thermal Processing (RTP) to be performed so that the activation ratio of the electric dopant impurities 2 is high without the surface of semiconductor layer 1b being damaged.

Furnace Annealing (FA) can also be performed to achieve an efficient diffusion of electric dopant impurities 2 in semiconductor layer 1b. This type of heat treatment is particularly suitable in the case of p-doping, as it enhances diffusion of the Mg dopants from layer 3b through layer 3a to semiconductor material layer 1b.

During the heat treatment step, it is therefore possible to perform furnace annealing, rapid annealing, or a combination of the different annealings depending on the result desired to be obtained.

For illustrative purposes, furnace annealing at a temperature comprised between 850 and 1250° C. can be performed for a period ranging from a few minutes to a few hours. Rapid annealing can also be performed in a temperature range from 850 to 1350° C. for a period comprised between a few seconds and a few minutes. Advantageously, the annealing or annealings can be performed in a controlled atmosphere containing a gas chosen from $N_2$, Ar, He, or $NF_3$, $NH_3$, or mixtures of $N_2/H_2$ or of $Ar/H_2$. It is preferable to avoid having an oxidizing atmosphere to limit diffusion of oxygen in the semiconductor matrix. It is preferable to use an atmosphere having a base of or formed by $N_2$, Ar, He, $NF_3$.

In general manner, the heat treatment can consist in a single furnace annealing, or a single rapid annealing, or any combination of rapid annealings and furnace annealings, whatever their number and order. It can advantageously comprise at least one annealing at a temperature of more than 1000° C. to obtain a high activation ratio of electric dopant impurities 2.

In comparison with the GaN doping methods of the prior art, associating an AlGaN-based cap block 3 and a Si-based covering layer 4 therefore enables annealing to be performed at a higher temperature and for a longer period.

Furthermore, implementation of standard furnace annealing enables an optimum distribution of electric dopant impurities 2 to be achieved by diffusion of the latter in semiconductor layer 1b. Implementation of rapid annealing at high temperature further enables a high activation ratio of electric dopant impurities 2 to be achieved. Cap block 3 and covering layer 4 for their part prevent damage to the surface of semiconductor layer 1b, degradation of its surface state, and modification of the chemical composition of the semiconductor material by nitrogen outgassing.

Furthermore, the heat treatment is performed under a pressure comprised between 1 and 15 kbar, advantageously between 1 bar and 1 kbar, and ideally between 1 and 10 bar.

When the heat treatment step has been terminated, the cap block and covering layer 4 have to be removed. To do this, a first etching step can be performed to perform take-off of covering layer 4 (cf. FIG. 10), successively followed by a second etching step to perform take-off of cap block 3 (cf. FIG. 11).

Take-off of silicon-based covering layer 4 can for example be performed by wet etching by means of hydrofluoric acid (HF) or phosphoric acid ($H_3PO_4$). AlN-based cap block 3 can also be taken-off by wet etching by means of phosphoric acid or KOH.

In alternative and advantageous manner, cap block 3 can be taken-off by Chemical Mechanical Planarization (CMP).

Figure 12:
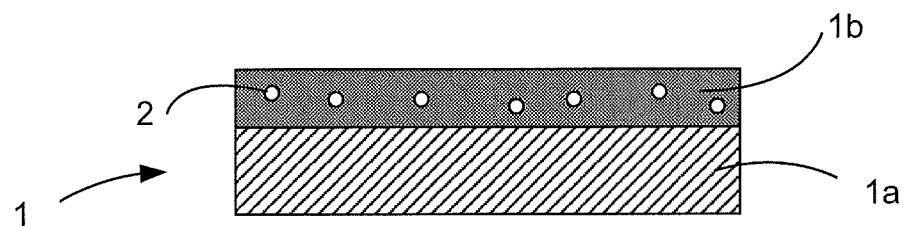
FIG. 12 represents the substrate provided with a semiconductor material layer provided with activated electric dopant impurities.

A substrate 1 is finally obtained comprising a semiconductor material layer 1b provided with n-type or p-type dopant impurities, with a very good activation ratio (cf. FIG. 12). The activation ratio of the p-type dopant impurities is comprised between 5 and 30%, and the activation ratio of the n-type dopant impurities is generally comprised between 50 and 100%.

Figure 13:
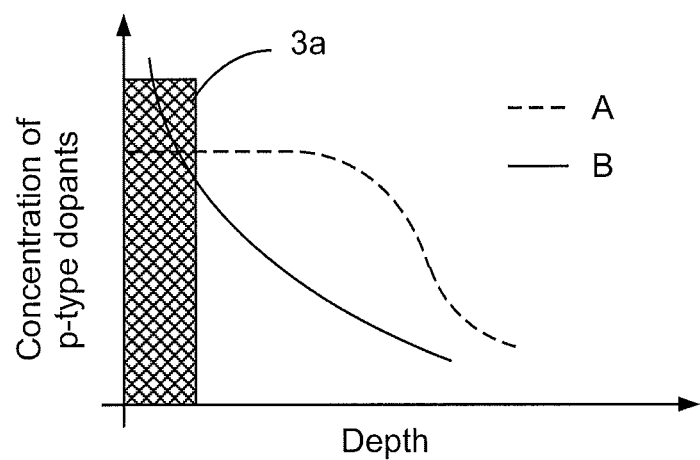
FIGS. 13 to 15 schematically represent the concentration profiles of p-type dopants in a GaN-based substrate when the latter is covered by a cap block, a covering layer, or a cap block and a covering layer.
Figure 14:
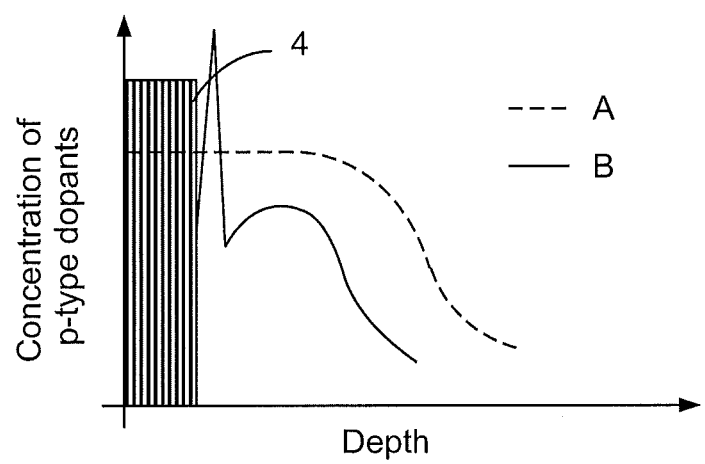
Figure 15:
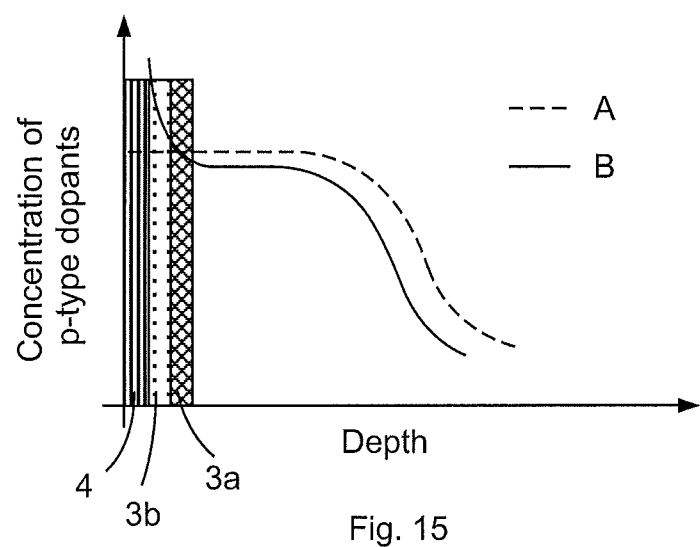

FIGS. 13 to 15 schematically illustrate the concentration profiles of p-type dopants in a GaN-based semiconductor for different stacks designed to protect the semiconductor when the anneals are performed. Implantation of the dopants was performed before or after deposition of the AlN-based and/or silicon-based cap layers, and the dopants can for example be Mg atoms. For each graph, plot A represents the dopant concentration profile before annealing, and plot B the dopant concentration profile after thermal annealing comprising at least one anneal at a temperature of more than 1000° C.

In the diagram illustrated in FIG. 13, semiconductor layer 1b is covered by a cap block 3 comprising a single AlGaN layer 3a. This layer 3a is deposited according to one of the techniques described in the foregoing, and has the properties set out beforehand. It can in particular be an AlN layer.

It is apparent that an AlGaN layer alone does not constitute an efficient barrier when thermal annealing is performed. The dopants were concentrated in the AlGaN layer or diffused when the annealing was performed.

For comparison purposes, FIG. 14 illustrates the case where semiconductor layer 1b is covered by a silicon-based cap layer 4 such as the one described above. This layer can for example be made from a material of $SiO_x$, $SiN_x$ or $Si_xN_y$ type.

Silicon-based cap layer 4 constitutes an efficient barrier against diffusion at high temperature of the dopants when the activation annealing is performed. However, the latter accumulate at the surface, and a concentration well is also observed at a slightly larger depth. The distribution of the dopants is therefore not optimal either.

FIG. 15 illustrates the case where semiconductor layer 1b is successively covered by a cap block 3 comprising an AlGaN layer 3a and a layer of Mg or MgO 3b, and a silicon-based covering layer 4.

The combination of these different layers not only enables a much larger quantity of dopants to be activated in the semiconductor matrix, but also makes it possible to have a substantially identical concentration compared with the initial implanted concentration, over a larger depth of the GaN layer. This stack constitutes an efficient barrier against diffusion of the dopants at high temperature, and also avoids the concentration peak and well that are obtained if the semiconductor is covered by a single silicon-based layer. Mg atoms can also diffuse through the AlGaN layer when annealing is performed so as to increase the quantity of dopants present in the GaN matrix.

The invention is not limited to the features that have been described in the foregoing. The person skilled in the art can, without departing from the scope of the invention, deposit the different layers of material on the substrate by any alternative technique such as PVD spraying, MOCVD, LPCVD, PECVD, etc.

Instead of performing ion implantation in semiconductor material layer 1b, the person skilled in the art can, without departing from the scope of the invention, dope this semiconductor layer by epitaxy when deposition of the latter is performed.

The person skilled in the art can also envisage to perform p-doping in certain areas of the GaN-based semiconductor material layer and n-doping in different areas. He can also dope the semiconductor material layer in certain areas and not perform doping in other areas of the layer. For this purpose, the mask can be used to protect certain areas of the substrate when ion implantation is performed.

Formation of structures made from n-doped or p-doped GaN is particularly useful for fabrication of high electron mobility transistors, Schottky diodes and optoelectronic components such as LEDs.

The invention claimed is:

1. A method for performing activation of p-type dopants in a GaN-based semiconductor comprising the following steps:
   providing a substrate comprising:
      a GaN-based semiconductor material layer provided with p-type electric dopant impurities,
      a cap block in contact with the GaN-based semiconductor material layer and comprising a layer consisting essentially of Mg or MgO, the cap block being devoid of any silicon-based compound, and
      a silicon-based covering layer covering the cap block, and performing a heat treatment at a temperature of more than 850° C. so as to activate the p-type electric dopant impurities in the GaN-based semiconductor material layer.

2. The method for performing activation of p-type dopants according to claim 1, wherein the layer consisting essentially of Mg or MgO has a thickness comprised between 1 nm and 30 nm.

3. The method for performing activation of p-type dopants according to claim 1, wherein the cap block further comprises an AlGaN layer positioned between the GaN-based semiconductor material layer and the layer consisting essentially of Mg or MgO, the AlGaN layer having a thickness comprised between 1 nm and 40 nm.

4. The method for performing activation of p-type dopants according to claim 3, wherein the AlGaN layer comprises Ga, and the Ga is present in an amount of up to 50 at. %.

5. The method for performing activation of p-type dopants according to claim 3, wherein the cap block comprises an additional AlGaN layer having a thickness comprised between 1 nm and 40 nm positioned between the layer consisting essentially of Mg or MgO and the silicon-based covering layer.

6. The method for performing activation of p-type dopants according to claim 1, wherein the cap block further comprises an AlN layer positioned between the GaN-based semiconductor material layer and the layer consisting essentially of Mg or MgO, the AlN layer having a thickness comprised between 1 nm and 40 nm.

7. The method for performing activation of p-type dopants according to claim 1, wherein deposition of the silicon-based covering layer is performed at a temperature of less than 850° C.

8. The method for performing activation of p-type dopants according to claim 1, wherein a thickness of the silicon-based covering layer is comprised between 5 nm and 500 nm.

9. The method for performing activation of p-type dopants according to claim 1, wherein the cap block is deposited on the GaN-based semiconductor material layer, and the p-type electric dopant impurities are then implanted in the GaN-based semiconductor material layer through the cap block before the heat treatment is performed.

10. The method for performing activation of p-type dopants according to claim 1, wherein the silicon-based covering layer is deposited on the cap block, and the p-type electric dopant impurities are then implanted in the GaN-based semiconductor material layer through the cap block and through the silicon-based covering layer before the heat treatment is performed.

11. A method for performing activation of p-type dopants in a GaN-based semiconductor comprising the following steps:
   providing a substrate comprising:
      a GaN-based semiconductor material layer provided with implanted p-type electric dopant impurities,
      a cap block in contact with the GaN-based semiconductor material layer and comprising a layer consisting essentially of Mg or MgO, devoid of any silicon-based compound, and
      a silicon-based covering layer covering the cap block, and
   performing a heat treatment at a temperature of more than 850° C. so as to activate the implanted p-type electric dopant impurities in the GaN-based semiconductor material layer.

12. The method for performing activation of p-type dopants according to claim 11, wherein the layer consisting essentially of Mg or MgO has a thickness comprised between 1 nm and 30 nm.

13. The method for performing activation of p-type dopants according to claim 11, wherein deposition of the silicon-based covering layer is performed at a temperature of less than 850° C.

14. The method for performing activation of p-type dopants according to claim 11, wherein the cap block is deposited on the GaN-based semiconductor material layer, and the p-type electric dopant impurities are then implanted in the GaN-based semiconductor material layer through the cap block before the heat treatment is performed.

15. The method for performing activation of p-type dopants according to claim 11, wherein the silicon-based covering layer is deposited on the cap block, and the p-type electric dopant impurities are then implanted in the GaN-based semiconductor material layer through the cap block and through the silicon-based covering layer before the heat treatment is performed.

16. A method for performing activation of p-type dopants in a GaN-based semiconductor comprising the following steps:
   providing a substrate comprising:
      a GaN-based semiconductor material layer provided with implanted p-type electric dopant impurities, and
      a cap block devoid of any silicon-based compound, in contact with the GaN-based semiconductor material layer, the cap block comprising
         a Mg or MgO layer,
         a first AlGaN layer positioned between the GaN-based semiconductor material layer and the Mg or MgO layer, and
         a second AlGaN layer positioned between the Mg or MgO layer and a silicon-based covering layer covering the cap block, and
   performing a heat treatment at a temperature of more than 850° C. so as to activate the implanted p-type electric dopant impurities in the GaN-based semiconductor material layer.

17. The method for performing activation of p-type dopants according to claim 16, wherein deposition of the silicon-based covering layer is performed at a temperature of less than 850° C.

18. The method for performing activation of p-type dopants according to claim 16, wherein a thickness of the silicon-based covering layer is comprised between 5 nm and 500 nm.

19. The method for performing activation of p-type dopants according to claim 16, wherein the cap block is deposited on the GaN-based semiconductor material layer, and the p-type electric dopant impurities are then implanted in the GaN-based semiconductor material layer through the cap block before the heat treatment is performed.

20. The method for performing activation of p-type dopants according to claim 16, wherein the silicon-based covering layer is deposited on the cap block, and the p-type electric dopant impurities are then implanted in the GaN-based semiconductor material layer through the cap block and through the silicon-based covering layer before the heat treatment is performed.

* * * * *